May 10, 1966 D. F. WILLMANN ETAL 3,251,002

FREQUENCY SELECTION SYSTEM HAVING GANG SWITCHED CRYSTAL OSCILLATORS

Filed May 20, 1964

2 Sheets-Sheet 1

INVENTORS,
DONALD F. WILLMANN
WILLIAM T. WOOD.
BY: Harry M. Saragovitz,
Edward J. Kelly,
Herbert Berl &
Julian C. Keppler
ATTORNEYS INVENTORS,
DONALD F. WILLMANN
WILLIAM T. WOOD.
BY: Harry M. Saragovitz,
Edward J. Kelly,
Herbert Berl &
Julian C. Keppler
ATTORNEYS.

3,251,002

FREQUENCY SELECTION SYSTEM HAVING GANG SWITCHED CRYSTAL OSCILLATORS

Donald F. Willmann and William T. Wood, Cincinnati, Ohio, assignors to the United States of America as represented by the Secretary of the Army Filed May 20, 1964, Ser. No. 369,032
2 Claims. (Cl. 331—8)

This invention relates to a crystal reference system for controlling the frequency of a local oscillator and more particularly to a combination of multi-crystal oscillators and a crystal selector switch.

Radio sets are usually stabilized by locking the local oscillator to a master clock. Piezoelectric crystal devices are commonly used for that purpose. These prove to be satisfactory in well designed equipment, but due to the expense involved, it is desirable to use one clock for many channels in multi-channel communication sets.

Various means have been devised for utilizing one clock for stabilizing a signal generator over an extended series of frequency steps. Such devices, often termed Crystal Reference Systems (CRS), usually offer savings in crystals at the cost of circuit and assembly disadvantages. An investigation of the aforementioned problem resulted in the present invention in which the combination of a mechanical selector and electronic circuitry offers advantages over the prior art.

The present invention relates to a CRS for conditioning twelve piezoelectric crystal frequencies to control and stabilize over nine hundred signal channels. The CRS insures that a local oscillator is locked on a selected operating channel by sampling the oscillator output comparing this sample with outputs from properly selected crystal oscillators and applying the resulting error voltage back to the oscillator. This invention particularly relates to two crystal oscillators and a mechanical switch which connects one of ten crystals into one reference oscillator while it alternately connects two crystals into the other reference oscillator.

An object of this invention is to achieve high speed channel selection from any one point to any other point in the tuning range.

Another object is to provide a high ratio of controlled channels per crystal.

Another object of this invention is to provide a novel combination of oscillators and a crystal selection switch therefor.

These and other objects and advantages of this invention will become apparent from the detailed description of the invention given in connection with the drawings in which.

Figure 1:
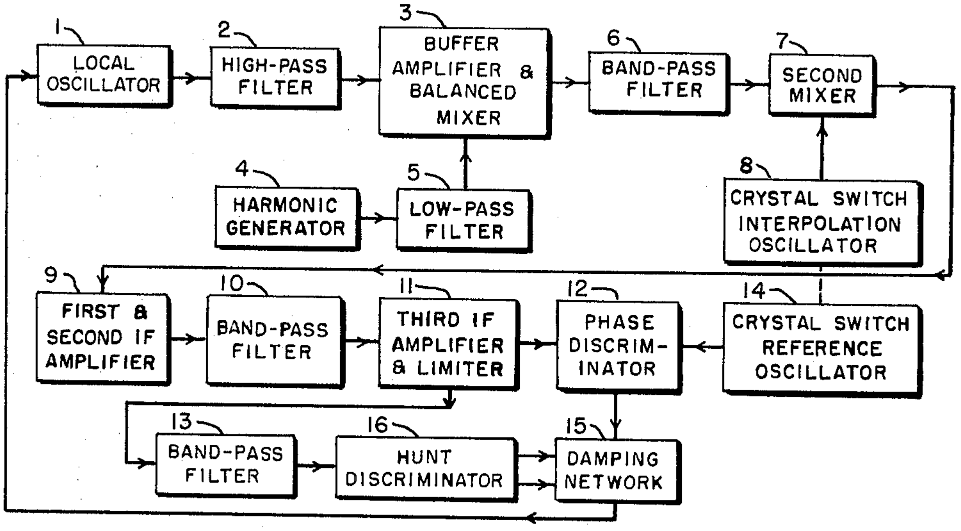
FIG. 1 is a block diagram of a crystal reference system.

A typical frequency synthesizer system governed by the present invention is shown in FIG. 1. The CRS, which is represented in this figure in block diagram form, is a closed loop control system which locks the radio receiver local oscillator on frequency. This is achieved by sampling the local oscillator output, comparing this sample with outputs of properly selected crystal oscillators and harmonics of these oscillators, and applying the resulting error voltage as a correction voltage through a diode frequency shift circuit back to the local oscillator. High and low side mixing are used. Bandswitching of the local oscillator is eliminated, and the CRS is required to control the local oscillator over a relatively narrow frequency range. The CRS effectively furnishes 920 crystal-controlled channels, each having a channel spacing of 50 kc.

FIG. 1 will be described with reference to a particular frequency range by way of example and not as a limiting factor on the invention. The output of a local oscillator 1 (ranging from 41.5 to 64.5 mc.) is applied through a high-pass filter 2, which passes frequencies above 41 mc. with minimum attenuation, to the buffer amplifier and balanced mixer 3. The output of a harmonic generator 4, which generates signals of 1 through 12 mc. in 1 mc. increments, is applied through low-pass filter 5, which passes all frequencies below 13 mc. to the balanced mixer 3. The balanced mixer heterodynes the two inputs, and its output is applied through a bandpass filter 6 to the second mixer 7. Filter 6 passes a narrow band of frequencies around 53 mc. The output from crystal switch interpolation oscillator 8, which may be one of ten frequencies, 46.85 to 47.75 mc. in 100 kc. steps, is also applied to the second mixer which heterodynes its two inputs to produce a CRS I.F. of 5.60 mc. for 100 kc. channel points or 5.65 mc. for 50 kc. channel points.

The 5.60 mc. or 5.65 mc. I.F. output is amplified by first and second I.F. amplifiers 9, filtered by a 5.625 mc. bandpass filter 10, and amplified and limited by third I.F. and limiter 11. One output from the limiter is applied to phase discriminator 12; another output is applied to a 5.625 mc. bandpass filter 13.

The crystal switch reference oscillator 14 provides a reference frequency of 5.60 mc. or 5.65 mc. to the phase discriminator 12, which compares the phase of its two input signals. If there is any phase difference present, an error voltage is fed back through a damping network 15 to the frequency control circuit of the local oscillator 1 to correct its operating frequency. The outputs of oscillators 8 and 14 are selected mechanically by the same crystal switch as is indicated by the dashed line in FIG. 1.

Figure 2:
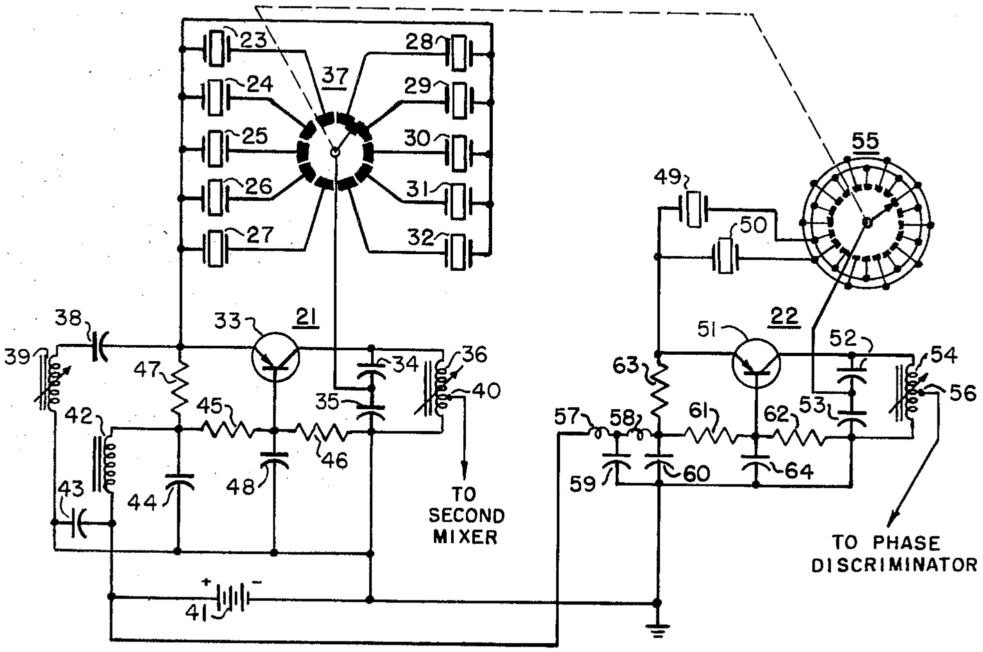
FIG. 2 is a schematic diagram of the crystal interpolation oscillator and the crystal reference oscillator which are used in the crystal reference system.

The output from filter 13 is applied to a hunt discriminator 16 which is similar to the sweep generating discriminator SD of FIG. 2 of U.S. Patent No. 2,881,319 granted on April 7, 1959 to A. R. Sills and assigned to the assignee of this invention. If the local oscillator is too far from the correct frequency to be corrected by the phase discriminator, hunt discriminator 16 will drive the local oscillator through the damping network 15 to within the pull-in and hold-in capabilities of the phase discriminator. The damping network stops the hunting action of the local oscillator when the phase discriminator acquires control of the local oscillator.

Particularly important in the present invention are the blocks representing the crystal switch interpolation oscillator and crystal switch reference oscillator which are shown in detail at 21 and 22 respectively in FIG. 2. The interpolation oscillator uses one of ten crystals 23 to 32 as its frequency determining element. This oscillator provides one of the two signals used in the second mixer to produce the CRS I.F.

The interpolation oscillator 21 utilizes a transistor 33 which is connected in a modified Colpitts oscillator circuit. The collector tank circuit contains capacitors 34 and 35 and the primary of an autotransformer 36. Oscillation is sustained by feeding back part of the energy from the collector tank circuit at the common connection of capacitors 34 and 35 through switch 37 and the selected crystal to the emitter of transistor 33. Capacitors 34 and 35 control the amount of energy that is fed back. Capacitor 38 and inductor 39 form a tuned circuit which is adjusted so that the maximum and minimum errors of the ten interpolation oscillator frequencies are equal.

The output appearing at the secondary tap 40 of the autotransformer 36 is fed to the second mixer 7 of FIG. 1.

A D.C. supply 41 supplies the oscillators 21 and 22 with operating potentials. A pi-filter network consisting of inductor 42 and capacitors 43 and 44 prevents oscillator output from feeding into the D.C. supply. A voltage divider comprising resistors 45 and 46 develops the fixed-bias portion of the emitter-to-base bias. Resistor 47 establishes the self-bias and is used for current stabilization. Capacitor 48 is an RF by-pass capacitor.

The crystal switch reference oscillator 22 utilizes one of two crystals 49 and 50 to provide a reference signal of known frequency to be compared with the CRS I.F. signal in the phase discriminator 12 of FIG. 1. A transistor 51 is connected in a modified Colpitts oscillator circuit in a manner similar to the circuit of transistor 33. The collector tuned circuit consists of capacitors 52 and 53 and an autotransformer primary 54. The feedback path from a point between capacitors 52 and 53 to the emitter of transistor 51 consists of a switch 55 and the crystals 49 and 50. The oscillator output signals, which are taken from secondary tap 56 of the autotransformer 54, are fed to the phase discriminator 12 of FIG. 1.

Oscillator 22 is also fed from D.C. supply 41. The network consisting of inductors 57 and 58 and capacitors 59 and 60 decouples the oscillator output from the D.C. supply. Resistors 61, 62 and 63 form the biasing network for the transistor 51, and capacitor 64 by-pass RF signals.

The ten piezoelectric crystals 23 to 32 are selectively inserted into the interpolation oscillator 21 with shorting in the transit of the moving contact from one fixed contact to the next adjacent contact. At least one crystal is connected in the circuit at all times. Two are tied in momentarily in the movement from one contact to the next. Switch 55 represents a two position switch which alternately selects one of the two crystals 49 and 50. Switches 37 and 55 are driven by the same switch shaft as indicated by the dashed line connecting them. Switch 55 moves to contact crystals 49 and 50 while the stationary contact of switch 37 is stationed on any one of the ten fixed contacts. Thus the two crystals 49 and 50 are sequentially switched into the circuit during the tenure of one contact on the ten crystal selector switch. Switch 55 is also of the make-before-break type. Therefore two inputs are always present at the phase discriminator 12 of FIG. 1.

Figure 3:
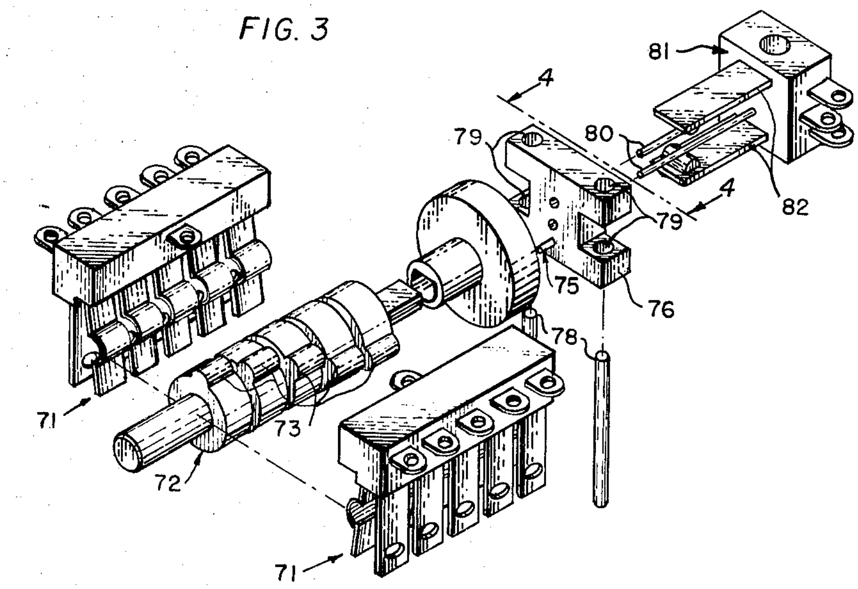
FIG. 3 is a drawing of the switch which selects the crystals for the two oscillators of FIG. 2
Figure 4:
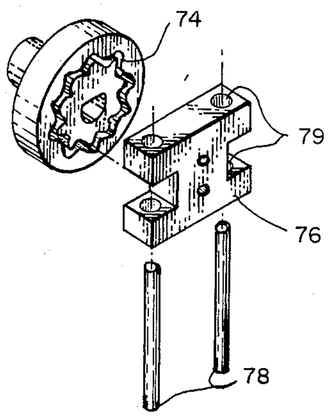
FIG. 4 is a view taken along line 4—4 of FIG 3.

Details of switches 37 and 55 are shown by exploded views in FIGS. 3 and 4. The ten position switch 37 consists of five pairs of spring driven contactors 71 mounted on opposite sides of a music box type rotor drum 72. Spurs 73 which are progressively spaced on the drum rotor sequentially actuate the ten switches in one complete revolution. The spurs are shaped and positioned on the drum to maintain a closed circuit at all times. A star raceway 74 (FIG. 4) at one end of the drum shaft engages a pilot pin 75 which is attached to a vertically moving member 76. Guide rods 78, which pass through holes 79 in member 76, restrict the direction of movement thereof. Two movable contacts 80 of a leaf type switch 81 are affixed to member 76. Vertical movement of member 76 causes contacts 80 to alternately engage fixed contacts 82 of the switch 81 which corresponds to switch 55 of FIG. 2. The spacing between contacts 80 and between contacts 82 is such that one of the switches is always closed.

Both the drum rotor and star raceway wheel should be fabricated of insulating material, preferably nylon. These two switches are mounted with their directly associated components and circuity in a compact assembly suitable for oven operation where close temperature control is desired.

Frequency selection is accomplished by a continuous low torque rotary action. One element is a read type switch actuated by spring driven leaves. The other switch element moves vertically, thereby driving a leaf type switch in a two position vertical movement. Combined circular and vertical drives are realized from a rotating shaft.

A practical embodiment of the present invention has been treated for convenience of description. It will be evident to persons skilled in the associated art that these new principles may be extended for a large variety of circuits and switching conditions.

What is claimed is:

1. A crystal reference system comprising: a local oscillator, the frequency of which is to be controlled; a harmonic generator; balanced mixer means connected to said local oscillator and harmonic generator for heterodyning the outputs thereof; a crystal interpolation oscillator having input and output electrodes; a plurality of crystals connected to said interpolation oscillator input electrode; a multi-position switch having a drum rotor, a plurality of spurs progressively spaced axially and circumferentially along said drum rotor, a plurality of pairs of single-pole single-throw switches mounted on opposite sides of said rotor so that each spur first closes one switch of its associated pair and then after a 180° rotation contacts the other switch of that pair; means to connect one terminal of each of said plurality of switches to said interpolation oscillator output electrode, the second terminal of each of said plurality of switches being respectively connected to said plurality of crystals; a second mixer, the inputs of which are connected to the outputs of said balanced mixer and said interpolation oscillator; a phase discriminator; a crystal reference oscillator having input and output electrodes; first and second crystals connected to said reference oscillator input electrode; a two position switch having a star raceway connected to one end of said drum rotor, a pair of vertically disposed rods, a vertically movable member which rides on said rods adjacent said star raceway, a pilot pin on one side of said vertically movable member for engagement in said star raceway, a pair of fixed contacts located adjacent said vertically movable member on the side thereof opposite said star raceway, and two movable contacts affixed to said vertically moving member and located between said pair of fixed contacts; means to connect one pair of said fixed or movable contacts to said reference oscillator output electrode; the other pair of said fixed or movable contacts being respectively connected to said two crystals; the outputs of said reference oscillator and said second mixer being connected to said phase discriminator; and means to connect the output of said phase discriminator to said local oscillator.

2. A crystal reference system comprising: a local oscillator, the frequency of which is to be controlled; a harmonic generator; balanced mixer means connected to said local oscillator and harmonic generator for heterodyning the outputs thereof; a first transistor oscillator having at least an emitter and a collector electrode; a plurality of crystals connected to said first transistor emitter electrode; a multi-position switch having a drum rotor, a plurality of spurs progressively spaced axially and circumferentially along said drum rotor, a plurality of pairs of single-pole single-throw switches mounted on opposite sides of said rotor so that each spur first closes one switch of its associated pair and then after a 180° rotation contacts the other switch of that pair; means to connect one terminal of each of said plurality of switches to said first transistor collector electrode, the second terminal of each of said plurality of switches being respectively connected to said plurality of crystals; a second mixer, the inputs of which are connected to the outputs of said balanced mixer and said first transistor oscillator; a phase discriminator; a second transistor oscillator having at least an emitter and a collector electrode; first and second crystals connected to said second transistor emitter electrode; a two position switch having a star raceway connected to one end of said drum; a pair of vertically disposed rods, a vertically movable member which rides on said rods adjacent said star raceway, a pilot pin on one side of said vertically movable member for engagement in said star raceway, a pair of fixed contacts located adjacent said vertically movable member on the side thereof opposite said star raceway, and two movable contacts affixed to said vertically moving member and located between said pair of fixed contacts; means to connect one pair of said fixed or movable contacts to said second transistor collector electrode; the other pair of said fixed or movable contacts being respectfully connected to said two crystals; the outputs of said reference oscillator and said second mixer being connected to said phase discriminator; and means to connect the output of said phase discriminator to said local oscillator.

References Cited by the Examiner

UNITED STATES PATENTS 2,704,329 3/1955 Law ---------------- 331—22

OTHER REFERENCES

Stoner: CQ, "Semiconductors," page 88, pub. August 1960.

ROY LAKE, *Primary Examiner.*

J. KOMINSKI, *Assistant Examiner.*